US012804818B2

(12) United States Patent
Li et al.

(10) Patent No.: US 12,804,818 B2
(45) Date of Patent: Nov. 17, 2026

(54) EQUIPMENT AUTOMATIC ALIGNMENT METHOD AND PROCESS ROBOT DEVICE USING THE SAME

(71) Applicant: UNITED MICROELECTRONICS CORP., Hsinchu (TW)

(72) Inventors: Zheng-Yang Li, Kaohsiung City (TW); Li-Hsin Yang, Tainan City (TW); Ming-Tung Wang, Pingtung County (TW); Shu-Mei Fang, Tainan City (TW); Chia-Chan Tsai, Tainan City (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 368 days.

(21) Appl. No.: 18/113,767

(22) Filed: Feb. 24, 2023

(65) Prior Publication Data

US 2024/0260198 A1 Aug. 1, 2024

(30) Foreign Application Priority Data

Feb. 1, 2023 (TW) ................................ 112103533

(51) Int. Cl.
*H05K 3/00* (2006.01)
*G06T 5/20* (2006.01)

(52) U.S. Cl.
CPC ............ *H05K 3/0008* (2013.01); *G06T 5/20* (2013.01); *H05K 2203/166* (2013.01)

(58) Field of Classification Search
CPC .......... H05K 3/0008; H05K 2203/166; G06V 10/245; G06V 2201/06
See application file for complete search history.

(56) References Cited

U.S. PATENT DOCUMENTS 5,410,259 A 4/1995 Fujihara
7,898,281 B2 3/2011 Andrews
(Continued)

OTHER PUBLICATIONS

Marchionna_2023, "Deep Instance Segmentation and Visual Servoing to Play Jenga with a Cost-Effective Robotic System", vol. 23, 1424-8220, 10.3390/s23020752, 2, Sensors, MDPI AG, Marchionna, Luca; Pugliese, Giulio; Martini, Mauro; Angarano, Simone; Salvetti, Francesco; Chiaberge, Marcello, Jan. 2023 (Year: 2023).*
(Continued)

*Primary Examiner* — Gregory A Morse
*Assistant Examiner* — Conor A O'Malley
(74) *Attorney, Agent, or Firm* — WPAT, PC

(57) ABSTRACT

An equipment automatic alignment method and a processing robotic device using the same are provided. The equipment automatic alignment method includes following steps. An image of an equipment is obtained. The image is enhanced to obtain a plurality of candidate patterns. Each of the candidate patterns is expanded to obtain a first rectangular block and a second rectangular block. A plurality of first target patterns is obtained according to the first rectangular block, and a plurality of second target patterns is obtained according to the second rectangular block. A first base point is obtained from the first target patterns, and a second base point is obtained from the second target patterns. An operation command is generated according to the first base point and the second base point to automatically control an operation interface of the equipment, so that the first base point is aligned with the second base point.

16 Claims, 6 Drawing Sheets

(56) References Cited

U.S. PATENT DOCUMENTS

| | | | | |
|---|---|---|---|---|
| 11,541,545 | B2 * | 1/2023 | Yamada | B25J 9/1697 |
| 2021/0092472 | A1 * | 3/2021 | Cho | H04N 21/4532 |
| 2022/0128485 | A1 | 4/2022 | Hsiao | |
| 2024/0142932 | A1 * | 5/2024 | Lin | G06V 20/41 |

OTHER PUBLICATIONS

Office Action issued by Taiwan Intellectual Property Office on Feb. 25, 2026.

Luca Marchionna et al., Deep Instance Segmentation and Visual Servoing to Play Jenga with a Cost-Effective Robotic System_ 20230109, Copyright: © 2023 by the authors, Licensee MDPI, Basel, Switzerland.

* cited by examiner

EQUIPMENT AUTOMATIC ALIGNMENT METHOD AND PROCESS ROBOT DEVICE USING THE SAME

This application claims the benefit of Taiwan application Ser. No. 112103533, filed Feb. 1, 2023, the disclosure of which is incorporated by reference herein in its entirety.

TECHNICAL FIELD

The disclosure relates in general to an equipment automatic control method and an electronic device using the same, and more particularly to an equipment automatic alignment method and a processing robotic device using the same.

BACKGROUND

Semiconductor manufacturing process requires a variety of equipment to perform testing, solder filling, etching and other processes. In some equipment, an alignment process is required. For example, the testing pins of the test equipment need to be aligned with the test pads. The solder outputting pin of the solder filling equipment needs to be aligned with the solder pads.

Traditionally, alignment must be done manually, but human errors often occur in the actual production line, resulting in a decline in product yield.

SUMMARY

The disclosure is directed to an equipment automatic alignment method and a processing robotic device using the same. The processing robotic device could automatically generate an operation command through various image analysis and processing programs to automatically control an operation interface of an equipment, so that the equipment can automatically complete an alignment process.

According to one embodiment, an equipment automatic alignment method is provided. The equipment automatic alignment method includes the following steps. An image of an equipment is obtained. The image is enhanced to obtain a plurality of candidate patterns. Each of the candidate patterns is expanded to obtain a first rectangular block and a second rectangular block. A plurality of first target patterns is obtained according to the first rectangular block, and a plurality of second target patterns is obtained according to the second rectangular block. A first base point is obtained from the first target patterns, and a second base point is obtained from the second target patterns. An operation command is generated according to the first base point and the second base point to automatically control an operation interface of the equipment, so that the first base point is aligned with the second base point.

According to another embodiment, a processing robotic device is provided. The processing robotic device includes an inputting unit, an enhancing unit, an expanding unit, a target capturing unit, a base analyzing unit and a command generating unit. The inputting unit is configured to obtain an image of an equipment. The enhancing unit is configured to enhance the image to obtain a plurality of candidate patterns. The expanding unit is configured to expand each of the candidate patterns to obtain a first rectangular block and a second rectangular block. The target capturing unit is configured to obtain a plurality of first target patterns according to the first rectangular block, and obtain a plurality of second target patterns according to the second rectangular block. The base analyzing unit is configured to obtain a first base point from the first target patterns, and obtain a second base point from the second target patterns. The command generating unit is configured to generate an operation command according to the first base point and the second base point to automatically control an operation interface of the equipment, so that the first base point is aligned with the second base point.

Figure 1:
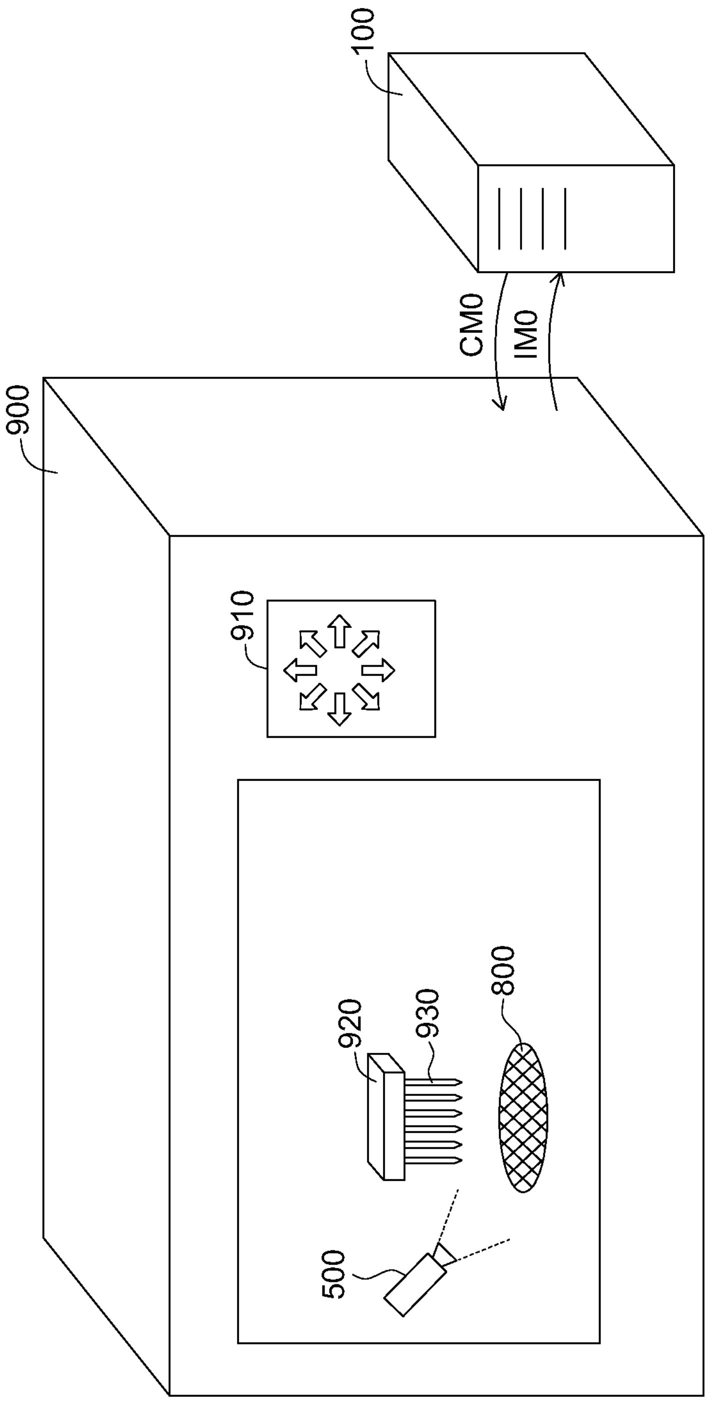
FIG. 1 illustrates the operation of an equipment according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which illustrates the operation of an equipment 900 according to an embodiment. The equipment 900 is described by taking the test equipment as an example, but not limited thereto. When testing the wafer 800, it is necessary to accurately align a plurality of testing pins 930 with a plurality of test pads of the wafer 800. In this embodiment, the testing pins 930 and the wafer 800 can be photographed by the image capturing unit 500 to obtain an image IM0. After the image IM0 is transmitted to a processing robotic device (also called Robotic Process Automation (RPA)) 100, the processing robotic device 100 analyzes and processes the image IM0 to automatically generate an operation command CM0. The operation command CM0 is used to automatically operate an operation interface 910 of the equipment 900, so that the testing pins 930 are accurately aligned with the test pads of the wafer 800.

In this embodiment, the processing robotic device 100 can automatically complete the operation of the operation interface 910 without manual judgment or operation, and smoothly make the testing pins 930 accurately align with the test pads of the wafer 800.

Figure 2:
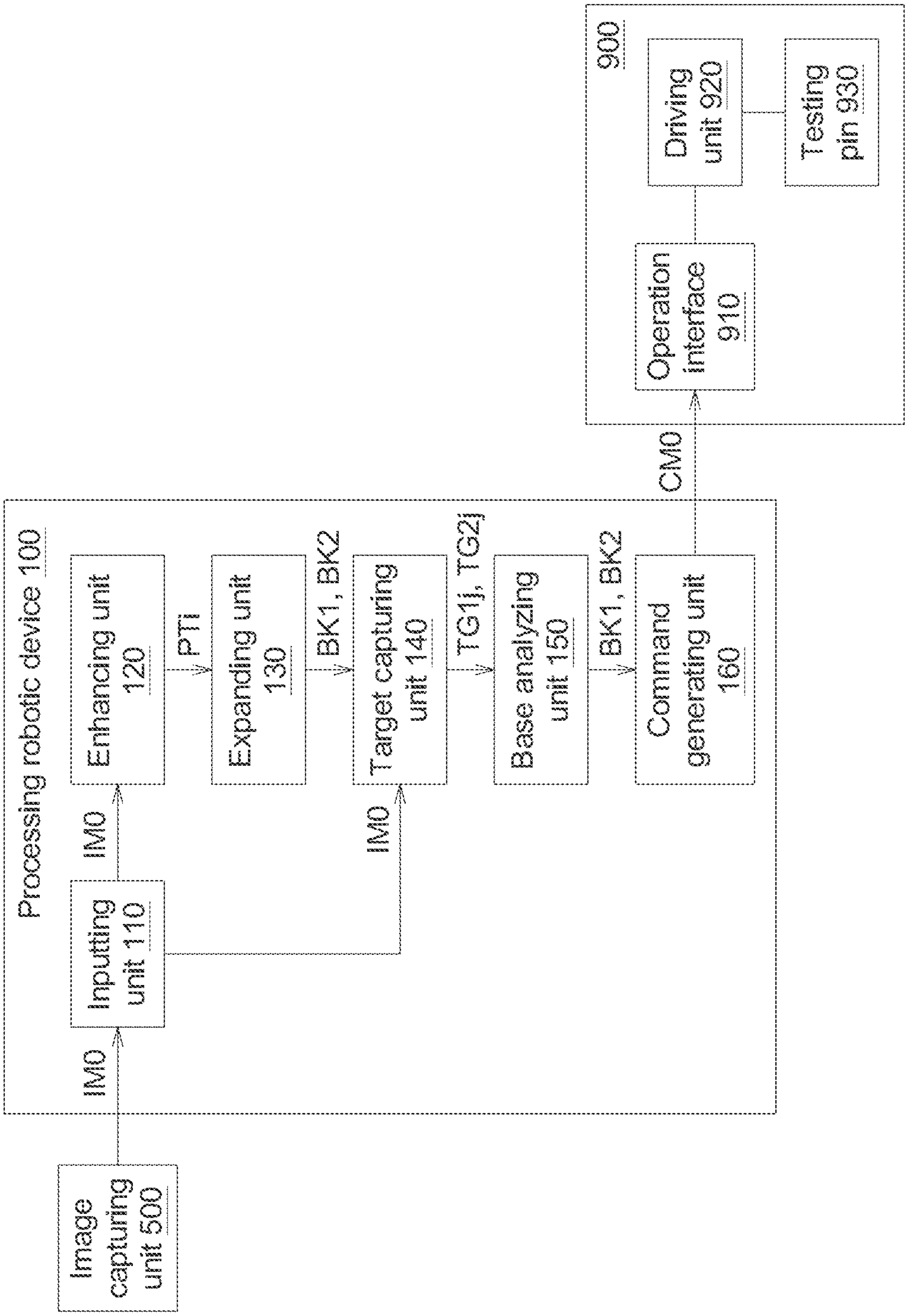
FIG. 2 illustrates a block diagram of a processing robotic device according to an embodiment.

Please refer to FIG. 2, which illustrates a block diagram of a processing robotic device 100 according to an embodiment. The processing robotic device 100 includes an inputting unit 110, an enhancing unit 120, an expanding unit 130, a target capturing unit 140, a base analyzing unit 150 and a command generating unit 160. The inputting unit 110 is used to input various data, such as a wireless transmission module, a wired transmission module, or a transmission line. The enhancing unit 120, the expanding unit 130, the target capturing unit 140 and the base analyzing unit 150 are used for image analysis and processing, such as a circuit, a chip, a circuit board, a computer program product, or a storage device for storing program codes. The command generating unit 160 is used to generate the operation command CM0 to automatically control the operation interface 910 of the equipment 900. The command generating unit 160 is, for example, a circuit, a chip, a circuit board, a computer program product, or a storage device for storing program codes.

In this embodiment, the image capturing unit 500 could take picture of the equipment 900 to input the image IM0 to the processing robotic device 100. The processing robotic device 100 can automatically generate the operation command CM0 through various image analysis and processing programs to automatically control the operation interface 910 of the equipment 900, so that the equipment 900 can automatically complete the alignment process. The operation of the above-mentioned components is described in detail below with a flow chart.

Figure 3:
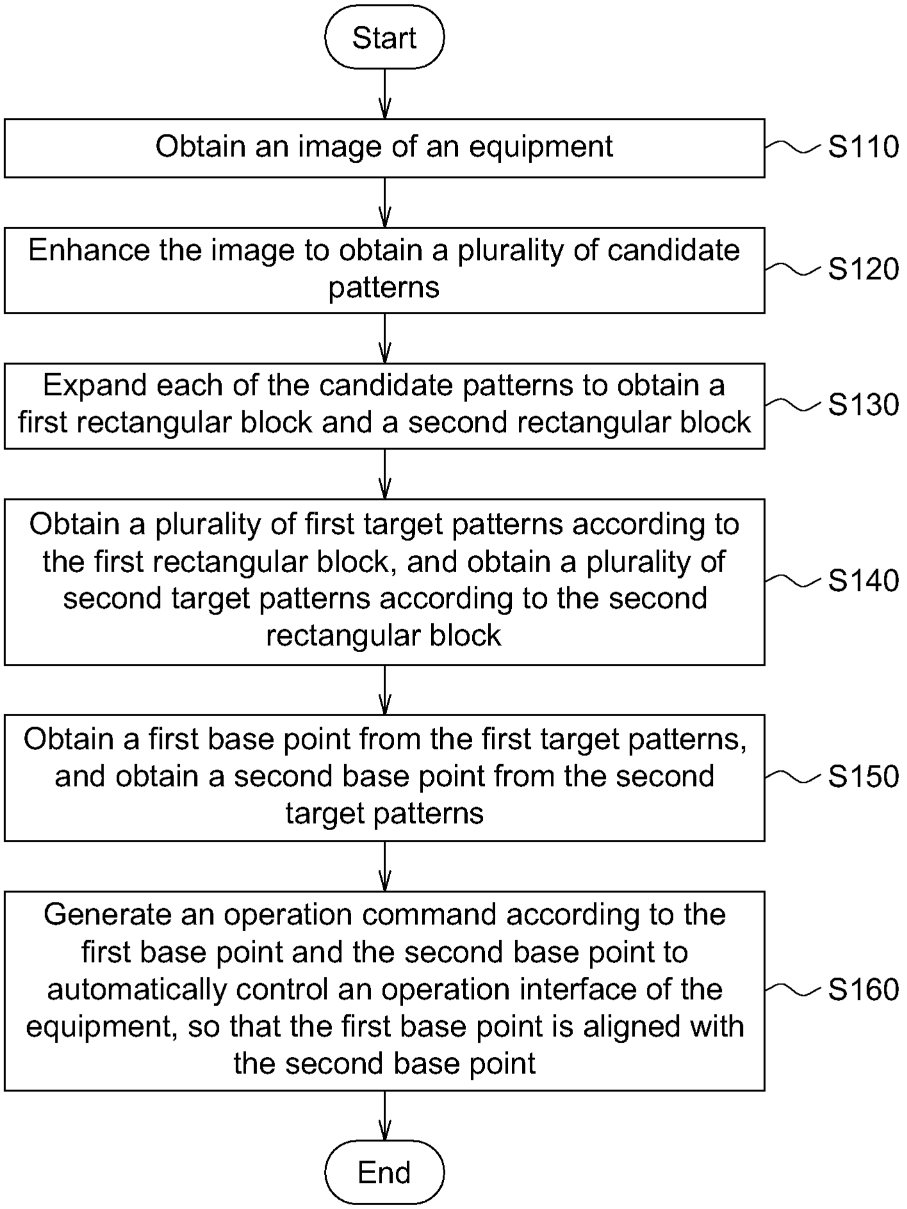
FIG. 3 shows a flowchart of an equipment automatic alignment method according to an embodiment.
Figure 4:
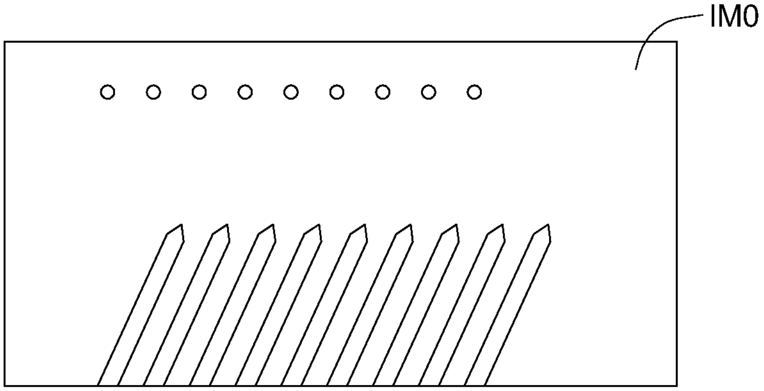
FIG. 4 illustrates the step S110 with an example.

Please refer to FIG. 3, which shows a flowchart of an equipment automatic alignment method according to an embodiment. In step S110, as shown in FIG. 4, the image IM0 of the equipment 900 is obtained by the inputting unit 110. FIG. 4 illustrates the step S110 with an example. The image capturing unit 500 is set up at a predetermined position to take pictures of the parts that need to be aligned. The image capturing unit 500 is set up at a predetermined position to take pictures of the parts that need to be aligned. As shown in FIG. 1, the image capturing unit 500 is installed inside the equipment 900, for example, to capture the testing pins 930 and the wafer 800. The image IM0 obtained by the image capturing unit 500 can be directly transmitted to the inputting unit 110 of the processing robotic device 100.

As shown in FIG. 4, although the human can quickly know the target to be aligned from the image IM0, the computer cannot directly know which objects are the targets to be aligned to the image IM0, and it needs to use the technical means proposed in this disclosure.

Figure 5:
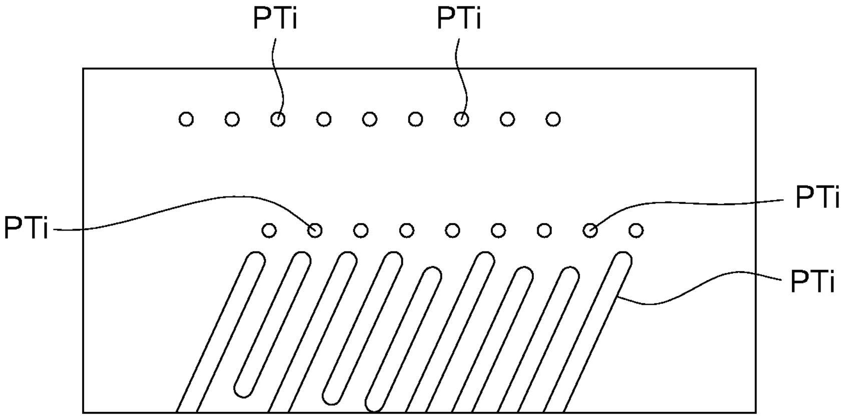
FIG. 5 illustrates the step S120 with an example.

Next, in step S120, as shown in FIG. 5, the enhancing unit 120 enhances the image IM0 to obtain a plurality of candidate patterns PTi. FIG. 5 illustrates the step S120 with an example. In one embodiment, the enhancing unit 120 can increase the brightness of the image IM0 to enhance each of the objects in the image IM0. Alternatively, the enhancing unit 120 can increase the contrast of the image IM0 to enhance each of the objects in the image IM0. As shown in FIG. 5, there are several candidate patterns PTi that may need to be aligned in the image IM0.

Figure 6:
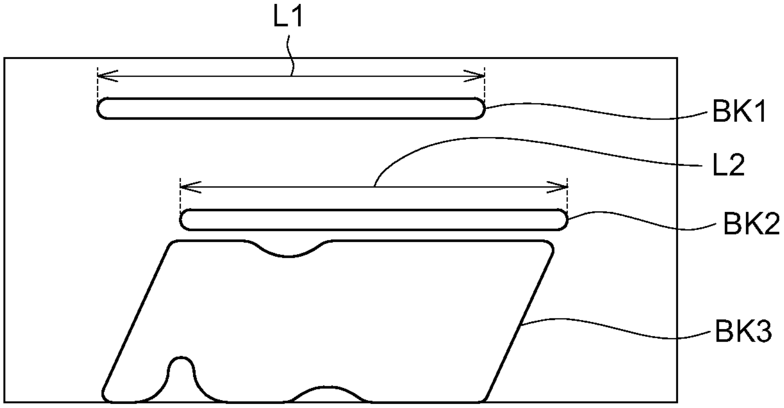
FIG. 6 illustrates the step S130 with an example.

Then, in step S130, as shown in FIG. 6, the expanding unit 130 expands the candidate patterns PTi to obtain a first rectangular block BK1 and a second rectangular block BK2. FIG. 6 illustrates the step S130 with an example. The expanding unit 130, for example, radially expands each of the candidate patterns PTi. Some adjacent candidate patterns PTi will be connected together after being expanded. As shown in FIG. 6, the candidate patterns PTi are extended to form the first rectangular block BK1, the second rectangular block BK2 and a third rectangular block BK3. In this step, the first rectangular block BK1 and the second rectangular block BK2 selected by the expanding unit 130 satisfy at least one of the following conditions. The first rectangular block BK1 and the second rectangular block BK2 are elongated structures. The length L1 of the first rectangular block BK1 and the length L2 of the second rectangular block BK2 are substantially identical. The first rectangular block BK1 is substantially parallel to the second rectangular block BK2.

In an embodiment, the expanding unit 130 may also consider multiple conditions at the same time, and select the first rectangular block BK1 and the second rectangular block BK2 that satisfy the most conditions.

Figure 7:
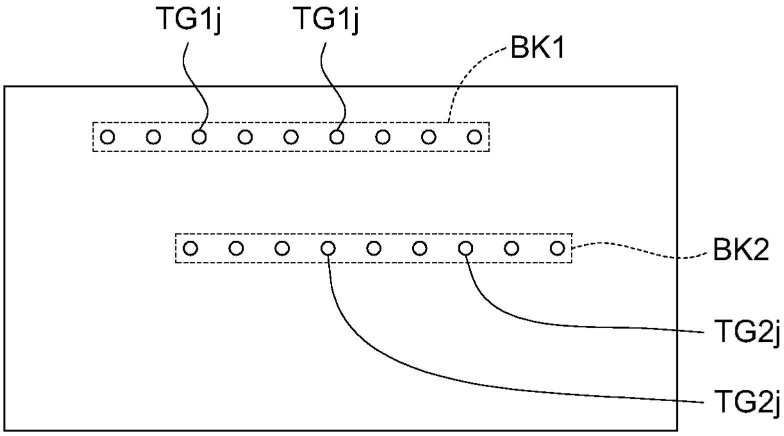
FIG. 7 illustrates the step S140 with an example.

Next, in step S140, as shown in FIG. 7, the target capturing unit 140 obtains a plurality of first target patterns TG1*j* according to the first rectangular block BK1, and obtains a plurality of second target patterns TG2*j* according to the second rectangular block BK2. FIG. 7 illustrates the step S140 with an example. In this step, the target capturing unit 140, for example, selects the first target patterns TG1*j* from the candidate patterns PTi according to the range of the first rectangular block BK1; the target capturing unit 140, for example, selects the second target patterns TG2*j* from the candidate patterns PTi according to the range of the second rectangular block BK2. The quantity of first target patterns TG1*j* and the quantity of the second target patterns TG2*j* are identical.

Figure 8:
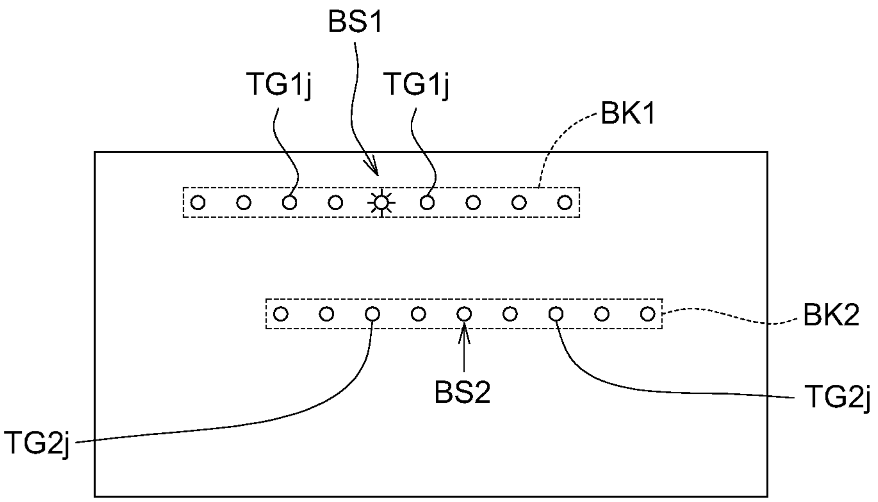
FIG. 8 illustrates the step S150 with an example.

Then, in step S150, as shown in FIG. 8, the base analyzing unit 150 obtains a first base point BS1 from the first target patterns TG1*j*, and obtains a second base point BS2 from the second target patterns TG2*j*. FIG. 8 illustrates the step S150 with an example. In one embodiment, the base analyzing unit 150, for example, obtains the first base point BS1 at the center of the first rectangular block BK1, and obtains the second base point BS2 at the center of the second rectangular block BK2.

Or, the base analyzing unit 150, for example, obtains the first base point BS1 at a predetermined order of the first target patterns TG1*j* (for example, the 5th order), and obtains the second base point BS2 at the predetermined order of the second target patterns TG2*j* (for example, the 5th order).

In addition, in the case that the first target pattern TG1*j* to be aligned is always fixed (such as a pinhole fixedly set in the equipment 900), the first base point BS1 can also be predefined.

Figure 9:
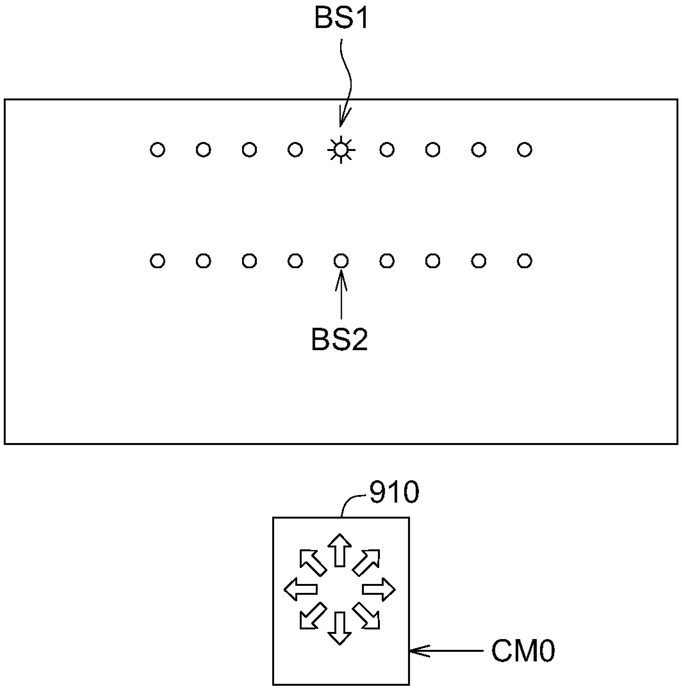
FIG. 9 illustrates the step S160 with an example.

Then, in step S160, as shown in FIG. 9, the command generating unit 160 automatically generates the operation command CM0 according to the first base point BS1 and the second base point BS2 to automatically control the operation interface 910 of the equipment 900, so that the first base point BS1 is aligned with the second base point BS2. FIG. 9 illustrates the step S160 with an example. The operation command CM0 includes commands for simulating operation interface 910, such as clicking buttons, dragging cursors, and inputting text. As shown in FIG. 2, the operation interface 910 can control the driving unit 920 according to the operation command CM0 to move the testing pins 930 so that the testing pins 930 are aligned with the test pads of the wafer 800.

According to the above embodiment, the processing robotic device 100 could automatically generate the operation command CM0 through various image analysis and processing programs to automatically control the operation interface 910 of the equipment 900, so that the equipment 900 can automatically complete the alignment process.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An equipment automatic alignment method, comprising:

obtaining an image of an equipment;

enhancing the image to obtain a plurality of candidate patterns, wherein the image is enhanced by increasing a brightness of the image or increasing a contrast of the image;

expanding each of the candidate patterns to form a first rectangular block, a second rectangular block and a third rectangular block, wherein some of the candidate patterns are expanded and then connected to form the first rectangular block, some of the candidate patterns are expanded and then connected to form the second rectangular block, and some of the candidate patterns are expanded and then connected to form the third rectangular block;

obtaining a plurality of first target patterns according to the first rectangular block, and obtaining a plurality of second target patterns according to the second rectangular block;

obtaining a first base point from the first target patterns, and obtaining a second base point from the second target patterns;

generating an operation command according to the first base point and the second base point to automatically control an operation interface of the equipment, so that the first base point is aligned with the second base point; and executing the operation command including clicking buttons, dragging cursors, and inputting text to move a plurality of testing pins so that the testing pins are aligned with a plurality of test pads of a wafer.

2. The equipment automatic alignment method according to claim 1, wherein the first base point is located at a predetermined order of the first target patterns, and the second base point is located at the predetermined order of the second target patterns.

3. The equipment automatic alignment method according to claim 1, wherein the first base point is located at a center of the first rectangular block, and the second base point is located at a center of the second rectangular block.

4. The equipment automatic alignment method according to claim 1, wherein the first rectangular block and the second rectangular block are strip structures.

5. The equipment automatic alignment method according to claim 1, wherein a length of the first rectangular block and a length of the second rectangular block are identical.

6. The equipment automatic alignment method according to claim 1, wherein the first rectangular block is parallel to the second rectangular block.

7. The equipment automatic alignment method according to claim 1, wherein in the step of enhancing the image, a brightness of the image is increased.

8. The equipment automatic alignment method according to claim 1, wherein a quantity of the first target patterns and a quantity of the second target patterns are identical.

9. A processing robotic device, comprising:

an inputting unit, configured to obtain an image of an equipment;

an enhancing unit, configured to enhance the image to obtain a plurality of candidate patterns, wherein the image is enhanced by increasing a brightness of the image or increasing a contrast of the image;

an expanding unit, configured to expand each of the candidate patterns to form a first rectangular block, a second rectangular block and a third rectangular block, wherein some of the candidate patterns are expanded and then connected to form the first rectangular block, some of the candidate patterns are expanded and then connected to form the second rectangular block, and some of the candidate patterns are expanded and then connected to form the third rectangular block;

a target capturing unit, configured to obtain a plurality of first target patterns according to the first rectangular block, and obtain a plurality of second target patterns according to the second rectangular block;

a base analyzing unit, configured to obtain a first base point from the first target patterns, and obtain a second base point from the second target patterns; and a command generating unit, configured to generate an operation command according to the first base point and the second base point to automatically control an operation interface of the equipment, so that the first base point is aligned with the second base point, wherein the operation command includes clicking buttons, dragging cursors, and inputting text, and the operation command is executed to move a plurality of testing pins so that the testing pins are aligned with a plurality of test pads of a wafer.

10. The processing robotic device according to claim 9, wherein the base analyzing unit obtains the first base point at a predetermined order of the first target patterns, and the base analyzing unit obtains the second base point at the predetermined order of the second target patterns.

11. The processing robotic device according to claim 9, wherein the base analyzing unit obtains the first base point at a center of the first rectangular block, and the base analyzing unit obtains the second base point at a center of the second rectangular block.

12. The processing robotic device according to claim 9, wherein the first rectangular block and the second rectangular block are strip structures.

13. The processing robotic device according to claim 9, wherein a length of the first rectangular block and a length of the second rectangular block are identical.

14. The processing robotic device according to claim 9, wherein the first rectangular block is parallel to the second rectangular block.

15. The processing robotic device according to claim 9, wherein the enhancing unit increases a brightness of the image.

16. The processing robotic device according to claim 9, wherein a quantity of the first target patterns and a quantity of the second target patterns are identical.

* * * * *